(12) United States Patent
Lu et al.

(10) Patent No.: US 10,854,520 B2
(45) Date of Patent: Dec. 1, 2020

(54) METHOD FOR FORMING SEMICONDUCTOR STRUCTURE

(71) Applicant: UNITED MICROELECTRONICS CORP., Hsin-Chu (TW)

(72) Inventors: Chia-Lin Lu, Taoyuan (TW); Chun-Lung Chen, Tainan (TW); Kun-Yuan Liao, Hsinchu (TW); Chun-Hsien Lin, Tainan (TW); Wei-Hao Huang, New Taipei (TW); Kai-Teng Cheng, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/416,279

(22) Filed: May 20, 2019

(65) Prior Publication Data

US 2019/0279909 A1 Sep. 12, 2019

Related U.S. Application Data

(62) Division of application No. 15/893,672, filed on Feb. 11, 2018, now abandoned.

(51) Int. Cl.
*H01L 21/8234* (2006.01)
*H01L 21/321* (2006.01)
*H01L 21/28* (2006.01)
*H01L 21/30* (2006.01)
*H01L 27/092* (2006.01)
*H01L 21/8238* (2006.01)

(52) U.S. Cl.
CPC .. *H01L 21/82345* (2013.01); *H01L 21/28088* (2013.01); *H01L 21/3003* (2013.01); *H01L 21/3212* (2013.01); *H01L 21/823462* (2013.01); *H01L 21/823842* (2013.01); *H01L 27/092* (2013.01)

(58) Field of Classification Search
None
See application file for complete search history.

(56) References Cited

U.S. PATENT DOCUMENTS

| 9,634,116 B2 | 4/2017 | Ando |
| 2014/0120707 A1 | 5/2014 | Ando |
| 2016/0020118 A1* | 1/2016 | Park .................. H01L 21/28088 438/592 |

* cited by examiner

*Primary Examiner* — Jack S Chen
(74) *Attorney, Agent, or Firm* — Winston Hsu

(57) ABSTRACT

The present invention provides a method for forming a semiconductor structure. The method including: Firstly, a substrate is provided, a first region and a second region are defined thereon, next, a gate dielectric layer and a work function metal layer are sequentially formed on the substrate within the first region and within the second region. Afterwards, a dielectric layer is formed on the work function metal layer within the second region, a hydrogen gas treatment is then performed on the substrate, and the work function metal layer is removed within the first region.

9 Claims, 6 Drawing Sheets

METHOD FOR FORMING SEMICONDUCTOR STRUCTURE

CROSS REFERENCE TO RELATED APPLICATIONS

This application is a divisional application of U.S. patent application Ser. No. 15/893,672 filed Feb. 11, 2018, which is herein incorporated by reference in its entirety.

BACKGROUND OF THE INVENTION

1. Field of the Invention

The invention relates to a manufacturing method for a semiconductor structure, and more particularly, to a manufacturing method for a semiconductor structure with performing an additional gas treatment to improve the reliability the semiconductor structure.

2. Description of the Prior Art

In the semiconductor industry, Moore's law states that the number of transistors on a chip doubles approximately every two years. These exponential performance gains present a challenge to the semiconductor manufacturing industry, along with the dual challenges of promoting power savings and providing cooling efficiency. The industry addresses these challenges in multiple ways. Selecting the gate dielectric and gate electrode are critical choices in enabling device scaling, and compatibility with CMOS technology. Two main approaches have emerged in high-k and metal gate (HKMG) integration: gate-first and gate-last. Gate-last is also called replacement metal gate (RMG) where the gate electrode is deposited after S/D junctions are formed and the high-k gate dielectric is deposited at the beginning of the process (high-k first).

A high-k first gate-last process is when the high-k dielectric is deposited first and the metal is deposited last (gate-last method). Gate-last is often referred to as the replacement gate option. "First" and "last" gate denotes whether the metal gate electrode is deposited before or after the high temperature anneal process. Typically, reliability of high-k gate stacks improve as a result of dopant activation anneal at temperatures around 1000° C., which is built in for gate-first or high-k first gate-last processes. The high-k last gate-last (replacement gate) process, however, lacks such built-in high temperature treatment, and thus reliability is a big challenge.

SUMMARY OF THE INVENTION

The present invention provides a method for forming a semiconductor structure. The method including: Firstly, a substrate is provided, a first region and a second region are defined thereon, next, a gate dielectric layer and a work function metal layer are sequentially formed on the substrate within the first region and within the second region. Afterwards, a dielectric layer is formed on the work function metal layer within the second region, a hydrogen gas treatment is then performed on the substrate, and the work function metal layer is removed within the first region.

The present invention provides a method for forming semiconductor structure. A gas treatment is additional performed on the substrate, such as a hydrogen gas treatment or a hydrogen and nitrogen gas combining treatment, so as to increase the TDBB (time dependent dielectric breakdown) and the reliability of the gate dielectric layer (high-k layer) and the work function metal layer, thereby improving the overall performance of the semiconductor device.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
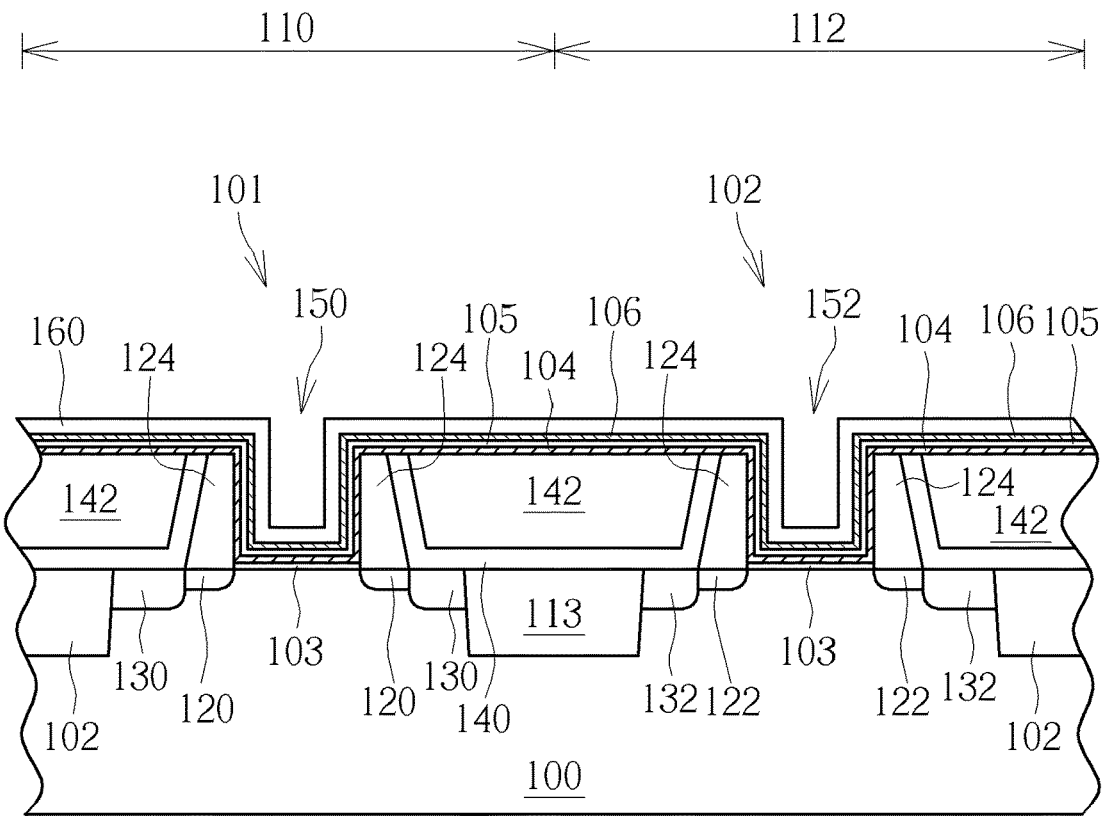
FIGS. 1-7 are drawings illustrating a manufacturing method for semiconductor structure provided by a first preferred embodiment of the present invention.

Please refer to FIGS. 1-7, which are drawings illustrating a manufacturing method for semiconductor structure provided by a first preferred embodiment of the present invention. As shown in FIG. 1, the preferred embodiment first provides a substrate 100 such as silicon substrate, silicon-containing substrate, or silicon-on-insulator (SOI) substrate. The substrate 100 includes a first semiconductor device 101 and a second semiconductor device 102 formed thereon. The first semiconductor device 101 is disposed within a first region 110, and the second semiconductor device 102 is disposed within a second region 112. A shallow trench isolation (STI) 113 is formed in the substrate 100 between the first semiconductor device 101 and the second semiconductor device 102 for providing electrical isolation. The first semiconductor device 101 includes a first conductivity type, the second semiconductor device 102 includes a second conductivity type, and the first conductivity type and the second conductivity type are complementary. In the preferred embodiment, the first conductivity type is p-type and the second conductivity type is n-type.

Please refer to FIG. 1. The first semiconductor device 101 and the second semiconductor device 102 respectively include a dielectric layer (not shown) and a dummy gate (not shown). The dielectric layer can be a conventional silicon oxide ($SiO_2$) layer and the dummy gate can include a polysilicon layer. Furthermore, the first semiconductor device 101 and the second semiconductor device 102 respectively include first lightly doped drains (LDDs) 120 and second LDDs 122, a spacer 124, a first source/drain 130 and a second source/drain 132. Additionally, salicides (not shown) may be respectively formed on the first source/drain 130 and the second source/drain 132. After forming the first semiconductor device 101 and the second semiconductor device 102, a contact etch stop layer (CESL) 140 and an inter-layer dielectric (ILD) layer 142 are selectively formed in sequence. Since the steps and material choices for the abovementioned elements are well-known to those skilled in the art, those details are omitted herein in the interest of brevity. Furthermore, selective strain scheme (SSS) can be used in the preferred embodiment. For example, a selective epitaxial growth (SEG) method can be used to form the first source/drain 130 and the second source/drain 132.

Please still refer to FIG. 1. After forming the CESL 140 and the ILD layer 142, a planarization process is performed to remove a portion of the ILD layer 142 and a portion of the CESL 140 to expose the dummy gates of the first semiconductor device 101 and the second semiconductor device 102. Then, a suitable etching process is performed to remove the dummy gates of the first semiconductor device 101 and the second semiconductor device 102, and thus a first gate trench 150 and a second gate trench 152 are simultaneously formed in the first semiconductor device 101 and the second semiconductor device 102, respectively. The dielectric layers or the substrate 100 are respectively exposed in bottoms of the first gate trench 150 and the second gate trench 152.

Next, an interfacial layer 103 is optionally formed on the substrate 10, and afterwards, a high-k dielectric layer 104 and a first bottom barrier layer 105 are sequentially formed on the substrate 100. The high-k dielectric layer 104 can include high-k material such as rare earth metal oxide. The high-k dielectric layer 104 can include material selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZrxTi_{1}-xO_3$, PZT), and barium strontium titanate ($BaxSr1-xTiO_3$, BST). In the preferred embodiment, the bottom barrier layer may be a single layer structure or a multiple layer structure, such as comprising the first bottom barrier layer 105 and the second bottom barrier layer 106, wherein the first bottom barrier layer 105 can include titanium nitride (TiN) and the second bottom barrier layer 106 can include tantalum nitride (TaN), but not limited to this.

After the high-k dielectric layer 104, the first bottom barrier layer 105 and the second bottom barrier layer 106 are formed, a first work function metal layer 160 is formed in the first gate trench 150 and the second gate trench 152. The first work function metal layer 160 is a p-type work function metal layer and exemplarily includes titanium nitride (TiN), tantalum nitride (TaN), titanium carbide (TiC), tantalum carbide (TaC), tungsten carbide (WC), or aluminum titanium nitride (TiAlN), but not limited to this. Or the first work function metal layer 160 includes an n-type work function metal layer such as titanium aluminide (TiAl), zirconium aluminide (ZrAl), tungsten aluminide (WAl), tantalum aluminide (TaAl), or hafnium aluminide (HfAl), but not limited to this. In addition, the first work function metal layer 160 can be a single-layered structure or a multi-layered structure.

Figure 2:
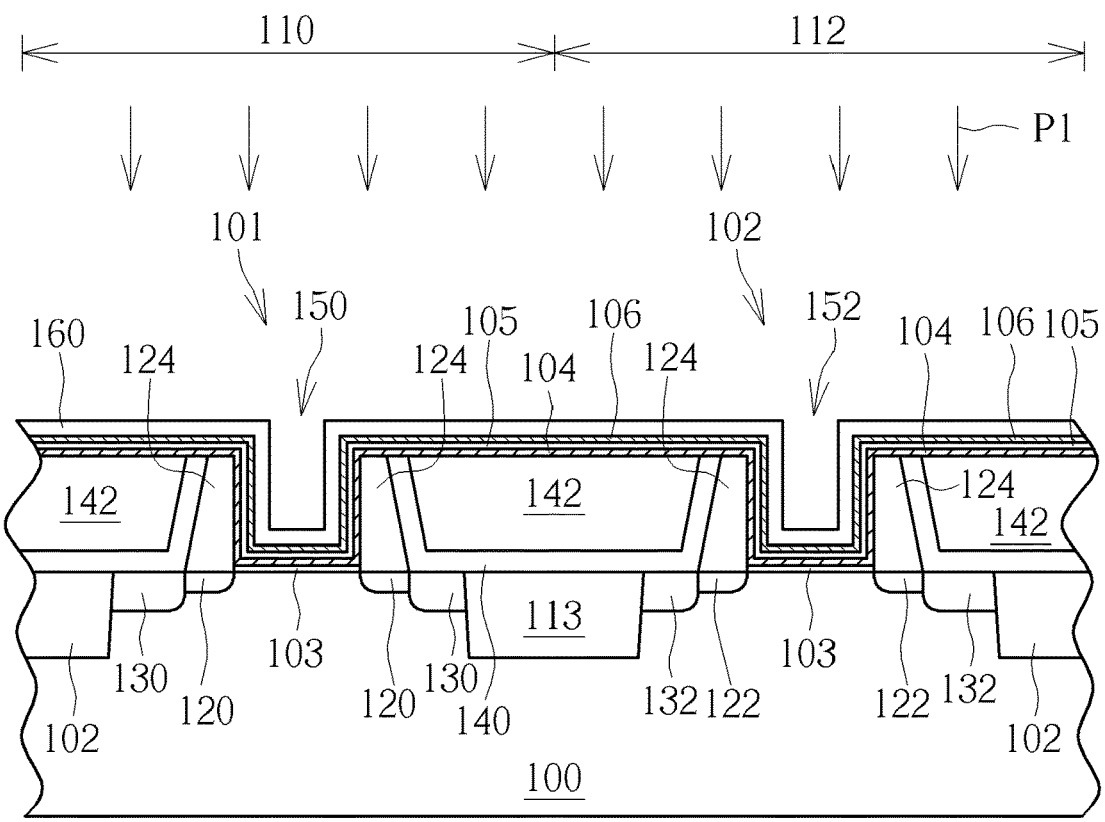

Afterwards, as shown in FIG. 2, a gas treatment P1 is performed on the substrate 100. In the present invention, the gas treatment P1 includes a hydrogen gas treatment or a hydrogen/nitrogen gas treatment, which is the gas treatment combining the hydrogen gas and the nitrogen gas, in other words, the hydrogen gas treatment and the nitrogen gas treatment are performed simultaneously. Preferably, the temperature in the gas treatment P1 of the present invention is between 25-500° C., the pressure of the gas treatment P1 of the present invention is between 0-1500 mtorr (millitorr), the flow rate of the hydrogen gas in the gas treatment P1 of the present invention is between 5-10000 sccm (standard cubic centimeter per minute), and the flow rate of the nitrogen gas in the gas treatment P1 of the present invention is between 0-5000 sccm, but not limited thereto. The parameters mentioned above can be adjusted according to actual requirements. The purpose for performing the gas treatment P1 is to improve the reliability of the semiconductor device. More precisely, the applicant found that after the gas treatment P1 is performed, the reliability of the high-k dielectric layer 104 and the first work function metal layer 160 are increased, therefore the performance of the overall device can be improved. For example, by the applicant's experiment, compared with the process without performing the gas treatment P1, the time dependent dielectric breakdown (TDDB) of the completed semiconductor device of the present invention is increased, and the maximum voltage of the hot carrier injection (HCI) is about 60 mV.

Figure 3:
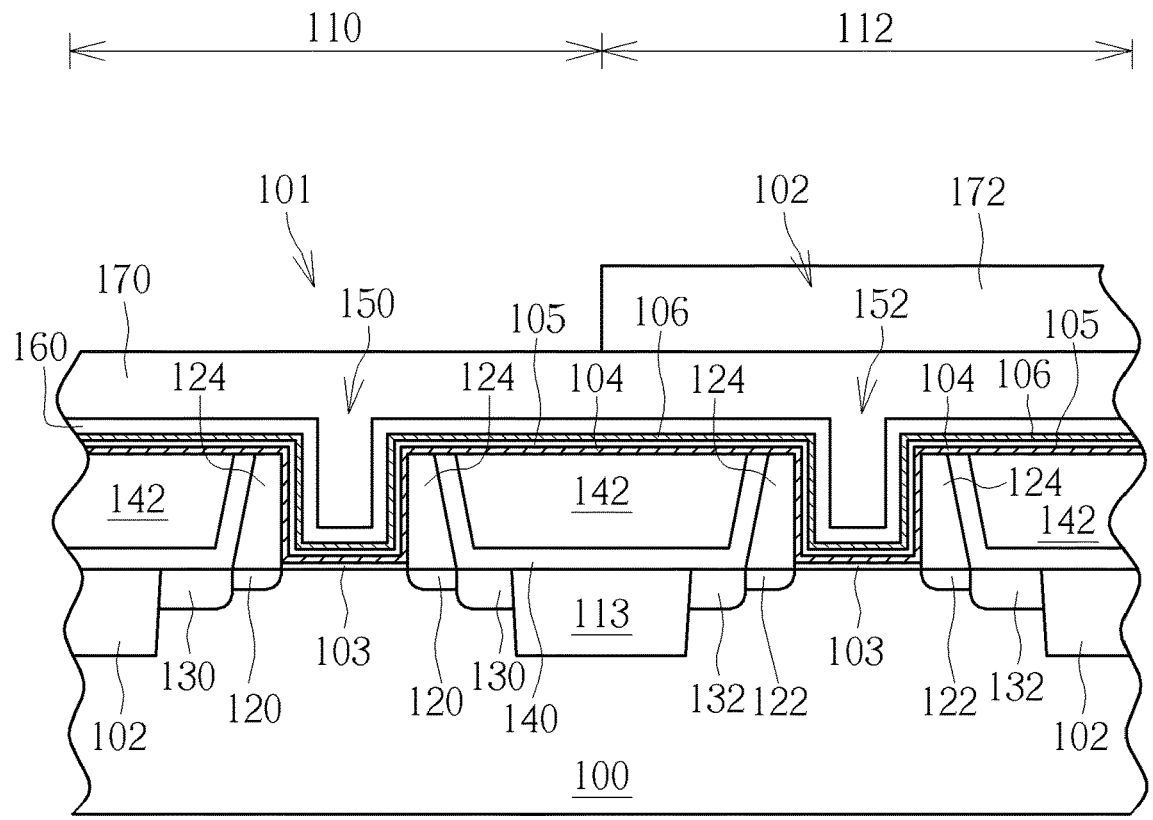
Figure 4:
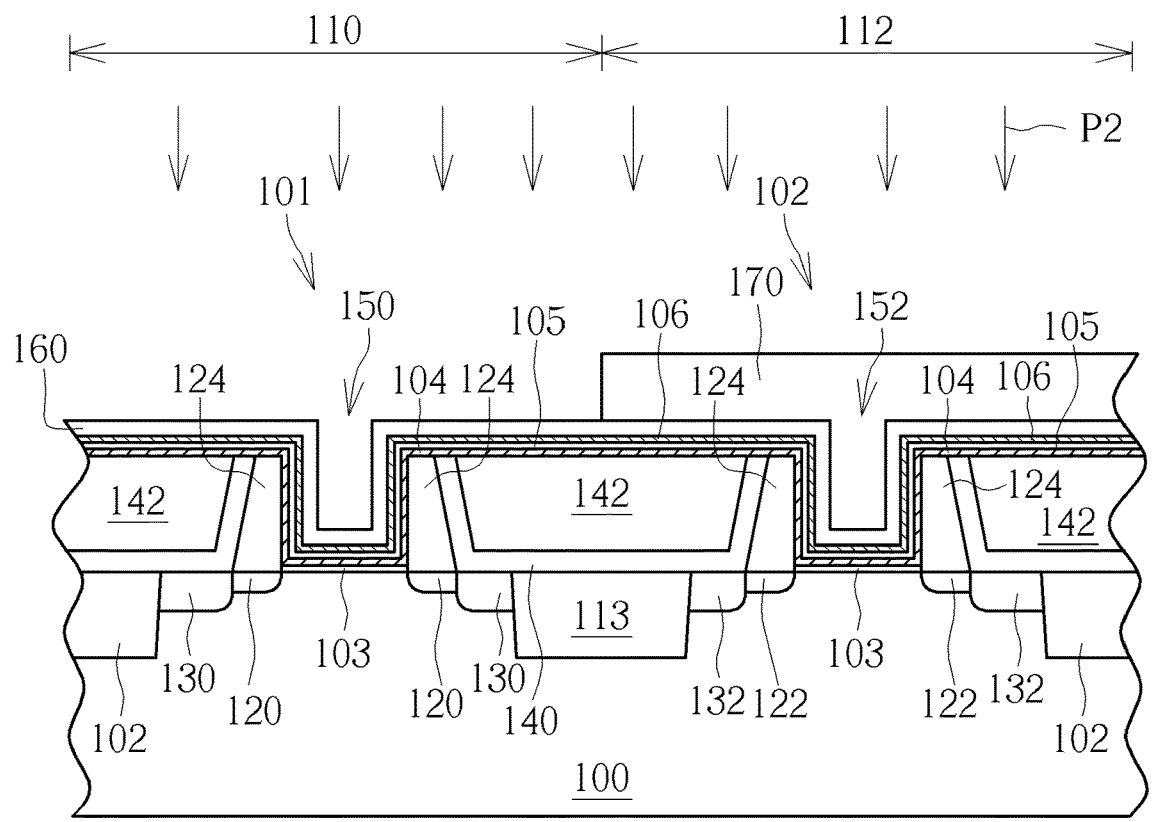
Figure 5:
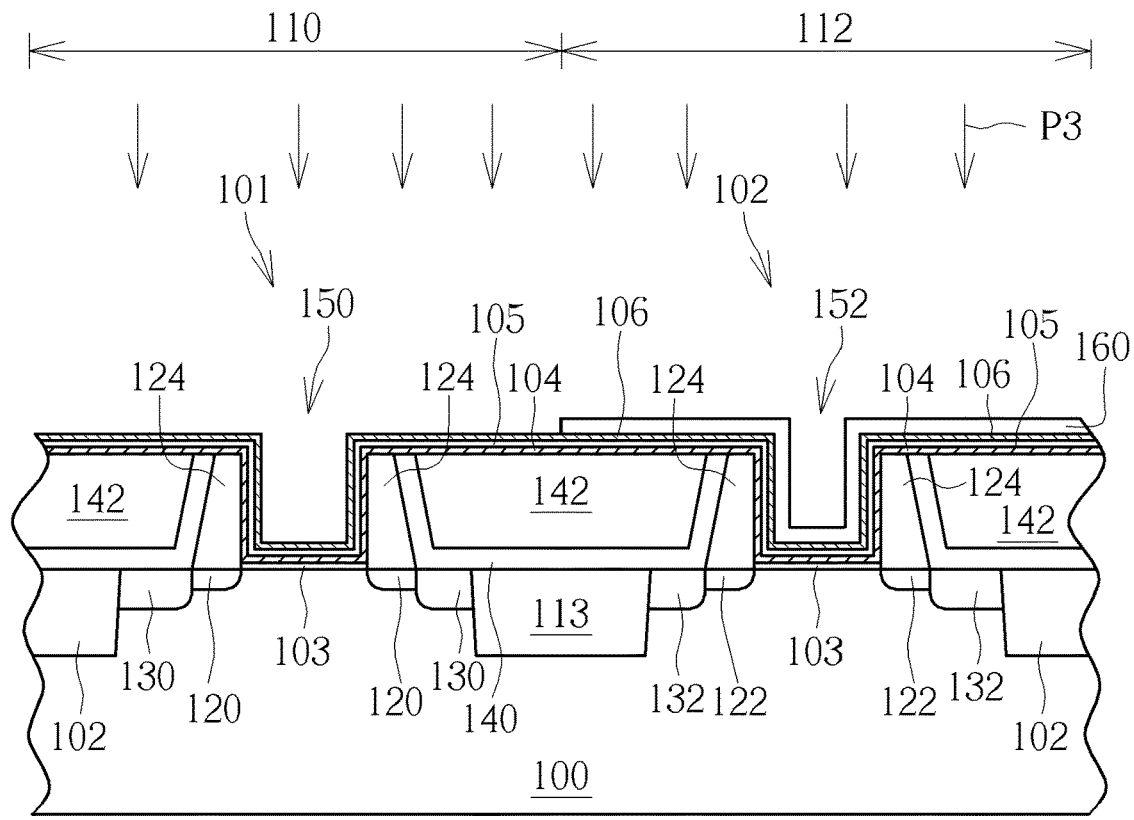

Next, as shown in FIG. 3, a dielectric layer 170 and a photoresist layer 172 are formed, the dielectric layer 170 is formed in the first gate trench 150 and the second gate trench 152, and the photoresist layer 172 is only disposed within the second region 112. Afterwards, as shown in FIG. 4, an etching step P2 is performed to remove parts of the dielectric layer 170 within the first region 110, so as to expose the first work function metal layer 160 in the first region 110. Next, as shown in FIG. 5, an etching step P3 is performed to remove parts of the first work function metal layer 160 within the first region 110. In other words, after the etching step P3 is performed, the first work function metal layer 160 is only disposed within the second region 112.

Figure 6:
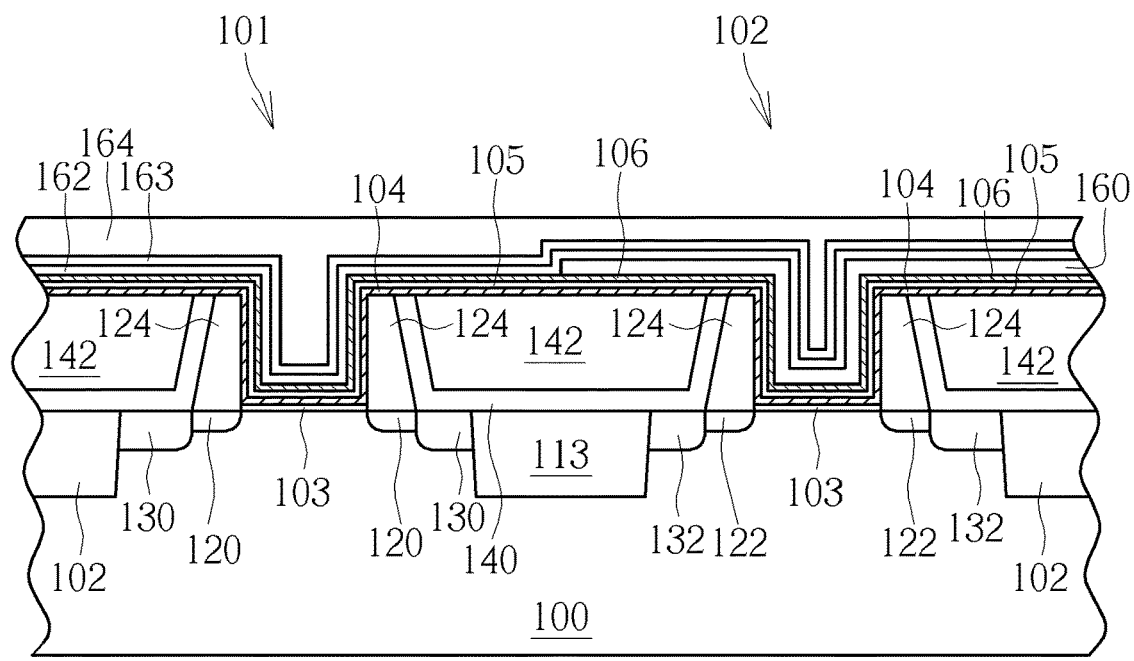

As shown in FIG. 6, after the first work function metal layer 160 is partially removed, a CVD process or a PVD process is then performed to form a second work function metal layer 162 on the substrate 100. In this embodiment, the second work function metal layer 162 includes an n-type work function metal layer such as titanium aluminide (TiAl), zirconium aluminide (ZrAl), tungsten aluminide (WAl), tantalum aluminide (TaAl), or hafnium aluminide (HfAl), but not limited to this. Or the second work function metal layer 162 is a p-type work function metal layer and exemplarily includes TiN, TaN, titanium carbide (TiC), tantalum carbide (TaC), tungsten carbide (WC), or aluminum titanium nitride (TiAlN), but not limited to this. Additionally, the second work function metal layer 162 can be a single-layered structure or a multi-layered structure.

Thereafter, a filling metal layer 164 is formed in both of the first gate trench 150 and the second gate trench 152. Additionally, a top barrier layer 163 is preferably formed between the second work function metal layer 162 and the filling metal layer 164. The top barrier layer 163 can include TiN, but not limited to this. The filling metal layer 164 is formed to fill up the first gate trench 150 and the second gate trench 152. The filling metal layer 164 includes materials with low resistance and superior gap-filling characteristic, such as W, Al, TiAl, or titanium aluminum oxide (TiAlO), but not limited to this.

It is noteworthy that in the present invention, the first work function metal layer 160 and the first semiconductor device 101 preferably have the same conductivity type. Take the embodiment mentioned above as an example. If the first semiconductor device 101 is p-type, and the second semiconductor device 102 is n-type, the first work function metal layer 160 is a p-type work function metal layer, and the second work function metal layer 162 is a n-type work function metal layer. However, in another embodiment of the present invention, if the first semiconductor device 101 is n-type, and the second semiconductor device 102 is p-type, the first work function metal layer 160 is a n-type work function metal layer, and the second work function metal layer 162 is a p-type work function metal layer. In this case, since the second work function metal layer 162 is a p-type work function metal layer, and the material of the second work function metal layer 162 may be the same as the material of the top barrier layer 163, such as TiN, the top barrier layer 163 is preferably omitted in that situation. Preferably, in the present invention, the first semiconductor device 101 is p-type, and the second semiconductor device 102 is n-type.

Figure 7:
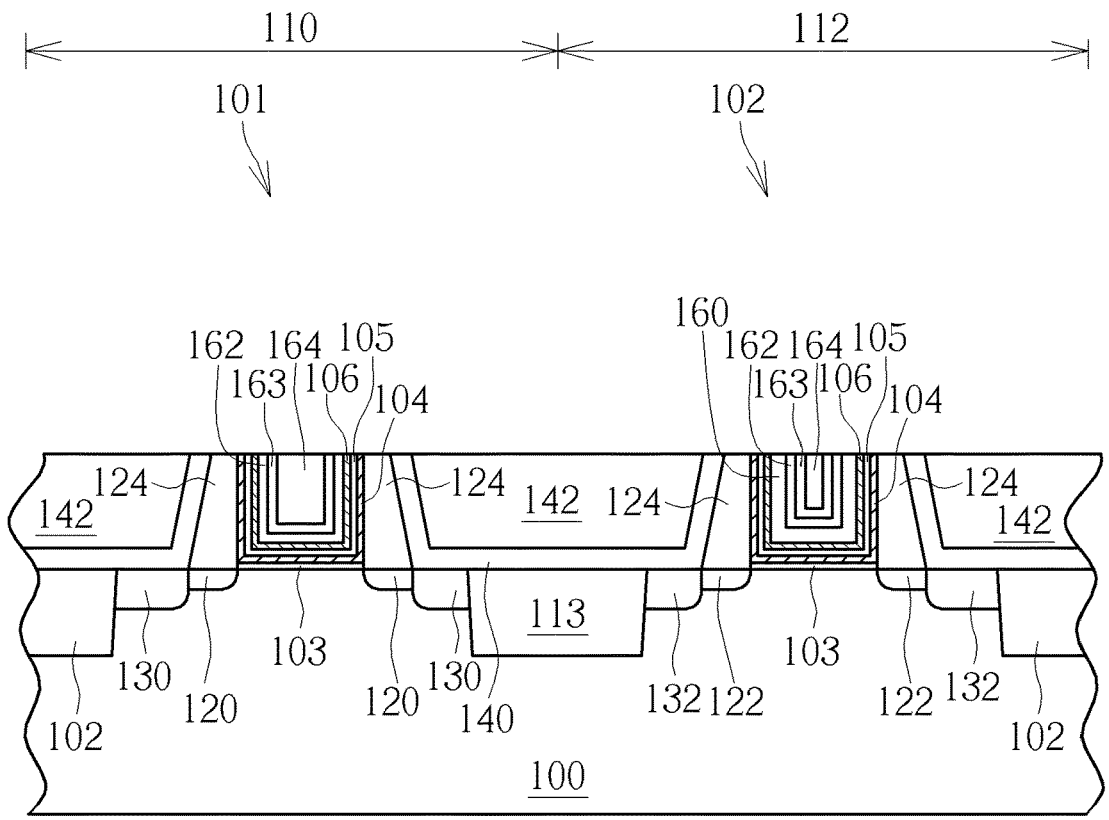

Subsequently, as shown in FIG. 7, a planarization process, such as a chemical mechanical polishing (CMP) process is performed to remove the unnecessary filling metal layer 164 and even the high-k dielectric layer 104 exposed on the ILD layer 142. Consequently, a first metal gate and a second metal gate are obtained. In addition, the ILD layer 140 and the CESL 142 can be selectively removed and sequentially reformed on the substrate 100 for improving performance of the semiconductor devices 101/102 in the preferred embodiment. Since the abovementioned CMP process is well-known to those skilled in the art, those details are omitted in the interest of brevity.

Figure 8:
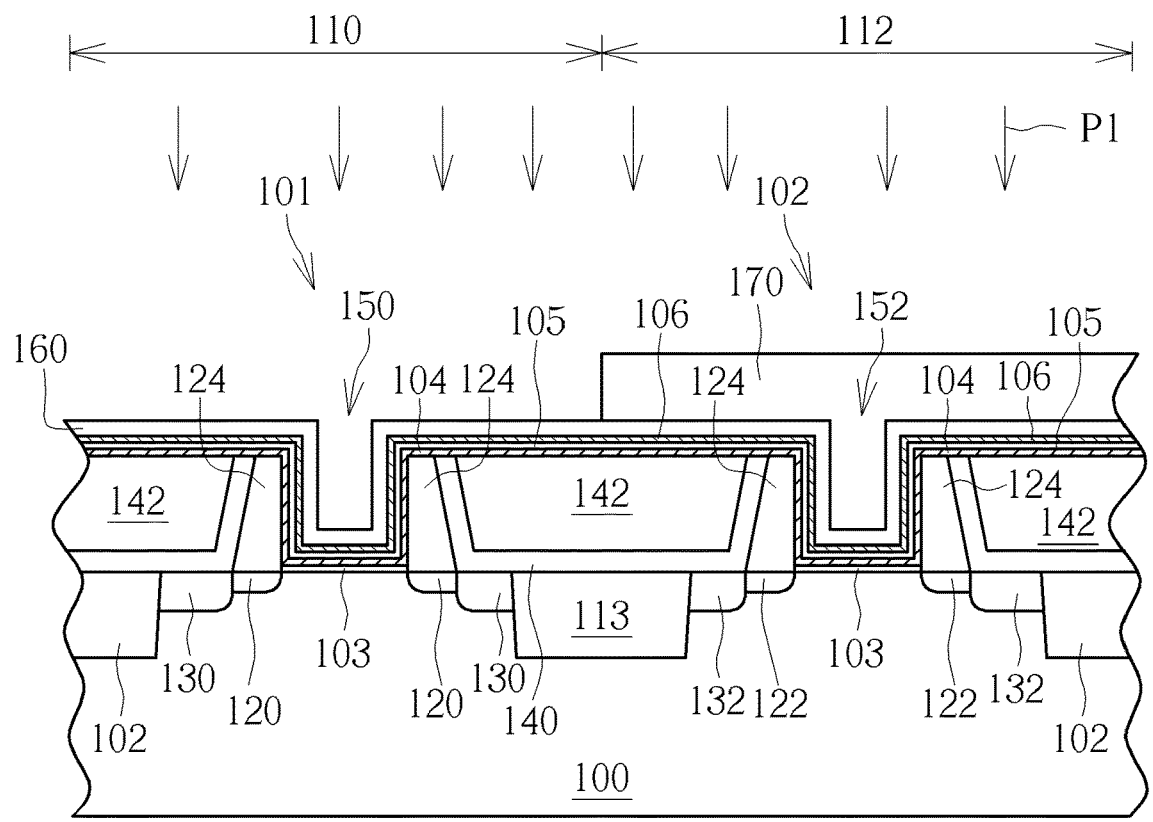
FIG. 8 is the drawing illustrating a manufacturing method for semiconductor structure provided by a second preferred embodiment of the present invention.

In another embodiment of the present invention, please refer to FIG. 8, which is the drawing illustrating a manufacturing method for semiconductor structure provided by a second preferred embodiment of the present invention. In this embodiment, the sequence for forming the gas treatment P1 is different from that of the first preferred embodiment. More precisely, after the first work function metal layer 160 is formed in the first gate trench 150 and a second gate trench 152 (please refer to FIG. 1 mentioned above), the gas treatment P1 hadn't been performed yet, and as shown in FIG. 8, the gas treatment P1 is performed after the dielectric layer 170 within the first region 110 which is partially removed. Afterwards, the first work function metal layer 160 within the first region 110 is then removed (please refer to FIG. 5 mentioned above), the following steps are same as that of the first preferred embodiment mentioned above. It should also be within the scope of the present invention. Except for the feature mentioned above, the other components, material properties, and manufacturing method of this embodiment are similar to the first preferred embodiment detailed above and will not be redundantly described.

Figure 9:
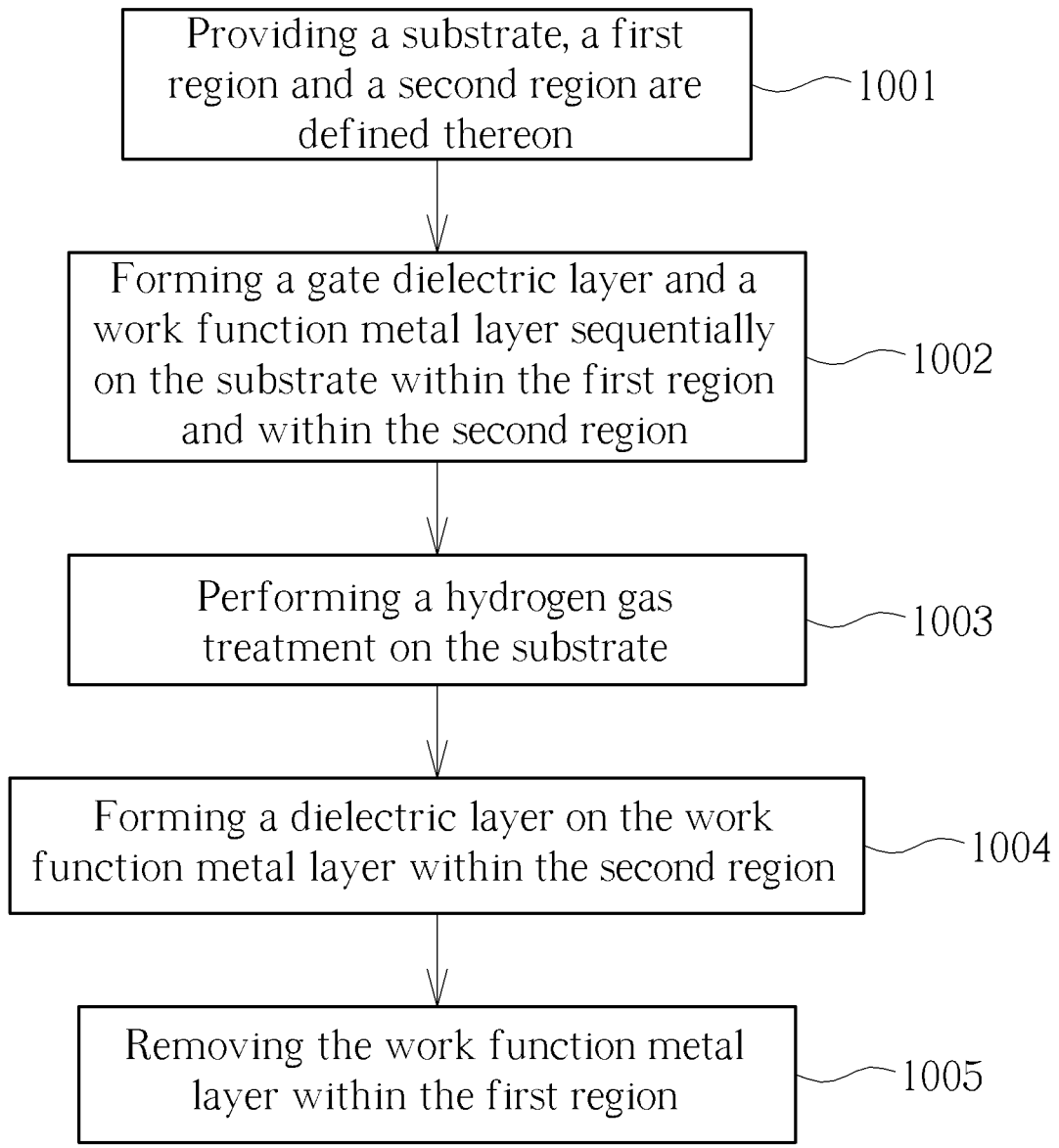
FIG. 9 shows a flow chart for forming a semiconductor structure according to the first embodiment of the present invention.

FIG. 9 shows a flow chart for forming a semiconductor structure according to the first embodiment of the present invention. As shown in FIG. 9, the method including: step 1001: providing a substrate 100, a first region 110 and a second region 112 are defined thereon; step 1002: forming a gate dielectric layer (high-k dielectric layer) 104 and a work function metal layer 160 sequentially on the substrate 100 within the first region 110 and within the second region 112 (please refer to FIG. 1); step 1003: performing a hydrogen gas treatment P1 on the substrate 100 (please refer to FIG. 2); step 1004: forming a dielectric layer 170 on the work function metal layer 160 within the second region 112 (please refer to FIG. 4); and step 1005: removing the work function metal layer 160 within the first region 110 (please refer to FIG. 5).

Figure 10:
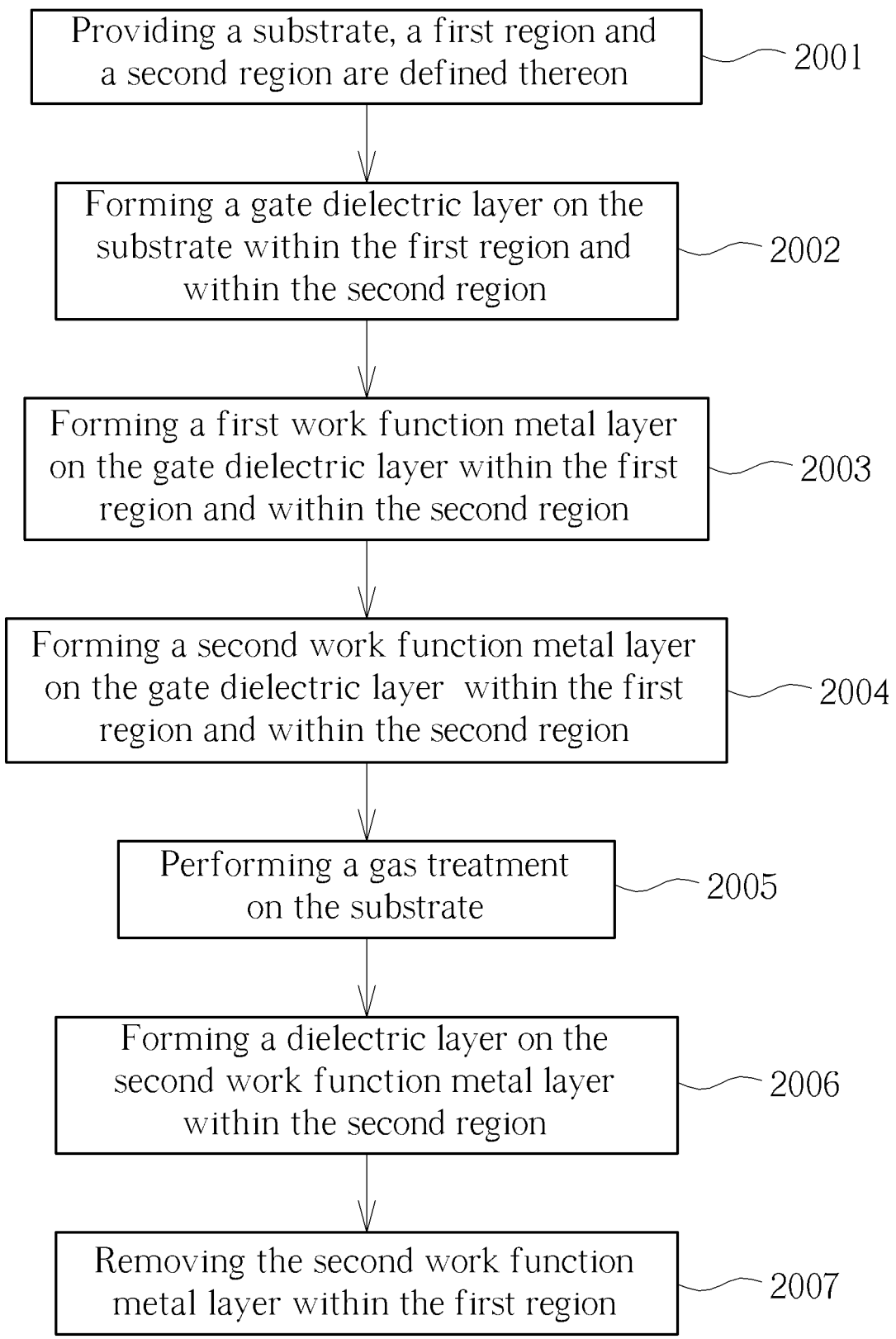
FIG. 10 shows a flow chart for forming a semiconductor structure according to another embodiment of the present invention.

In another embodiment of the present invention, the gas treatment P1 can be performed after the first work function metal layer 160 and the second work function metal layer 162 are formed. In other words, the step shown in FIG. 2 is skipped, and the gas treatment P1 can be performed after the second work function metal layer 162 is formed. FIG. 10 shows a flow chart for forming a semiconductor structure according to another embodiment of the present invention. As shown in FIG. 10, the method including: step 2001: providing a substrate 100, a first region 110 and a second region 112 are defined thereon; step 2002: forming a gate dielectric layer (high-k dielectric layer) 104 on the substrate 100 within the first region 110 and within the second region 112 (please refer to FIG. 1); step 2003: forming a first work function metal layer 160 on the gate dielectric layer 104 within the first region 110 and within the second region 112; step 2004: forming a second work function metal layer 162 on the gate dielectric layer 104 within the first region 110 and within the second region 112; step 2005: performing a gas treatment P1 on the substrate 100; step 2006: forming a dielectric layer 170 on the second work function metal layer 162 within the second region 112; and step 2007: removing the second work function metal layer 162 within the first region 110. Except for the features mentioned above, the other components, material properties, and manufacturing method of this embodiment are similar to the first preferred embodiment detailed above and will not be redundantly described.

Besides, in another case, the gas treatment P1 can be performed after the dielectric layer 170 within the second region 112 is formed (for example, the step 2005 shown in FIG. 10 can be performed after the step 2006), or can be performed after the second work function metal layer 162 within the first region 110 is removed (for example, the step 2005 shown in FIG. 10 can be performed after the step 2007). It should also be within the scope of the present invention.

In summary, the present invention provides a method for forming semiconductor structure. A gas treatment is additional performed on the substrate, such as a hydrogen gas treatment or a hydrogen and nitrogen gas combining treatment, so as to increase the TDBB (time dependent dielectric breakdown) and the reliability of the gate dielectric layer (high-k layer) and the work function metal layer, thereby improving the overall performance of the semiconductor device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A method for forming a semiconductor structure, comprising:
providing a substrate, a first region and a second region are defined thereon;
forming a gate dielectric layer, a first bottom barrier layer, a second bottom barrier layer and a work function metal layer sequentially on the substrate within the first region and within the second region, wherein a material of the first bottom barrier layer is different from a material of the second bottom barrier layer;

forming a dielectric layer on the work function metal layer within the second region;

performing a hydrogen gas treatment on the substrate, wherein the hydrogen gas treatment is performed after the dielectric layer is formed; and removing the work function metal layer within the first region.

2. The method of claim 1, wherein a temperature in the hydrogen gas treatment is between 25° C.-500° C.

3. The method of claim 1, wherein the step for removing the work function metal layer within the first region does not remove the work function metal layer within the second region.

4. The method of claim 1, further comprising forming at least two trenches within the first region and within the second region respectively, wherein the gate dielectric layer and the work function metal layer are disposed in the trenches.

5. The method of claim 1, wherein when the hydrogen gas treatment is performed, the work function metal layer still covers on the gate dielectric layer.

6. The method of claim 1, wherein the gate dielectric layer comprises hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZrxTi_{1-x}O_3$, PZT), barium strontium titanate ($Ba_xSr_{1-x}TiO_3$, BST) and a combination thereof.

7. The method of claim 1, wherein the work function metal layer comprises titanium nitride (TiN) and tantalum nitride (TaN).

8. The method of claim 1, wherein the hydrogen gas treatment is performed to the gate dielectric layer, the first bottom barrier layer, the second bottom barrier layer and the work function metal layer.

9. The method of claim 1, further comprising performing a chemical mechanical polishing (CMP) process after the work function metal is removed.

* * * * *